United States Patent [19]

Murakami et al.

[11] Patent Number: 4,642,609
[45] Date of Patent: Feb. 10, 1987

[54] INTEGRATION TYPE ANALOG-TO-DIGITAL CONVERTER HAVING CONTINUOUSLY CHARGING AND DISCHARGING FUNCTIONS

[75] Inventors: Jyōji Murakami; Kenzi Yamada, both of Kawasaki, Japan

[73] Assignee: Fujitsu Limited, Kawasaki, Japan

[21] Appl. No.: 685,953

[22] Filed: Dec. 24, 1984

Related U.S. Application Data

[63] Continuation of Ser. No. 380,699, May 21, 1982, abandoned.

[30] Foreign Application Priority Data

May 28, 1981 [JP] Japan .................. 56-79991

[51] Int. Cl.⁴ .......................... H03M 1/54
[52] U.S. Cl. .................. 340/347 AD; 340/347 M; 340/347 NT; 340/347 CC
[58] Field of Search .... 340/347 M, 347 AD, 347 NT, 340/347 CC; 324/99 D

[56] References Cited

U.S. PATENT DOCUMENTS

| | | | |
|---|---|---|---|
| 3,316,547 | 4/1967 | Ammann | 340/347 AD |
| 3,368,149 | 2/1968 | Wasserman | 340/347 NT |
| 3,879,724 | 4/1975 | McDonald | 340/347 AD |
| 4,232,302 | 11/1980 | Jagatich | 340/347 SH X |
| 4,268,820 | 5/1981 | Hareyama | 340/347 NT |
| 4,395,701 | 7/1983 | Evans | 340/347 NT |

FOREIGN PATENT DOCUMENTS

| | | | |
|---|---|---|---|
| 149755 | 12/1978 | Japan | 307/279 |
| 869262 | 5/1961 | United Kingdom . | |

OTHER PUBLICATIONS

Hewlett-Packard Journal, vol. 28, No. 6, Feb. 1977, "A Fast-Reading, High-Resolution Voltmeter That Calibrates Itself Automatically", Gookin, pp. 2-10.

Funabashi et al, An NMOS Microcomputer Peripheral Interface Unit—, IEEE Journal of Solid-State Circuits, vol. SC-15, No. 1, 2/1980, pp. 38-43.

Mitchell et al, Data Averager for Panel Meter Operates from Meter's Clock, Electronics, 26 Apr. 1973, p. 103.

Primary Examiner—T. J. Sloyan
Attorney, Agent, or Firm—Staas & Halsey

[57] ABSTRACT

An analog-to-digital converter comprising one or more charging and discharging circuits ($C_A$ and/or $C_B$), a control circuit (6' and/or 6"), and a timer-counter (7). The control circuit performs the discharging operation alternately and continuously on the charging and discharging circuits. The timer-counter counts a predetermined number of times the discharging operation is performed so as to create a digital value (T).

5 Claims, 19 Drawing Figures

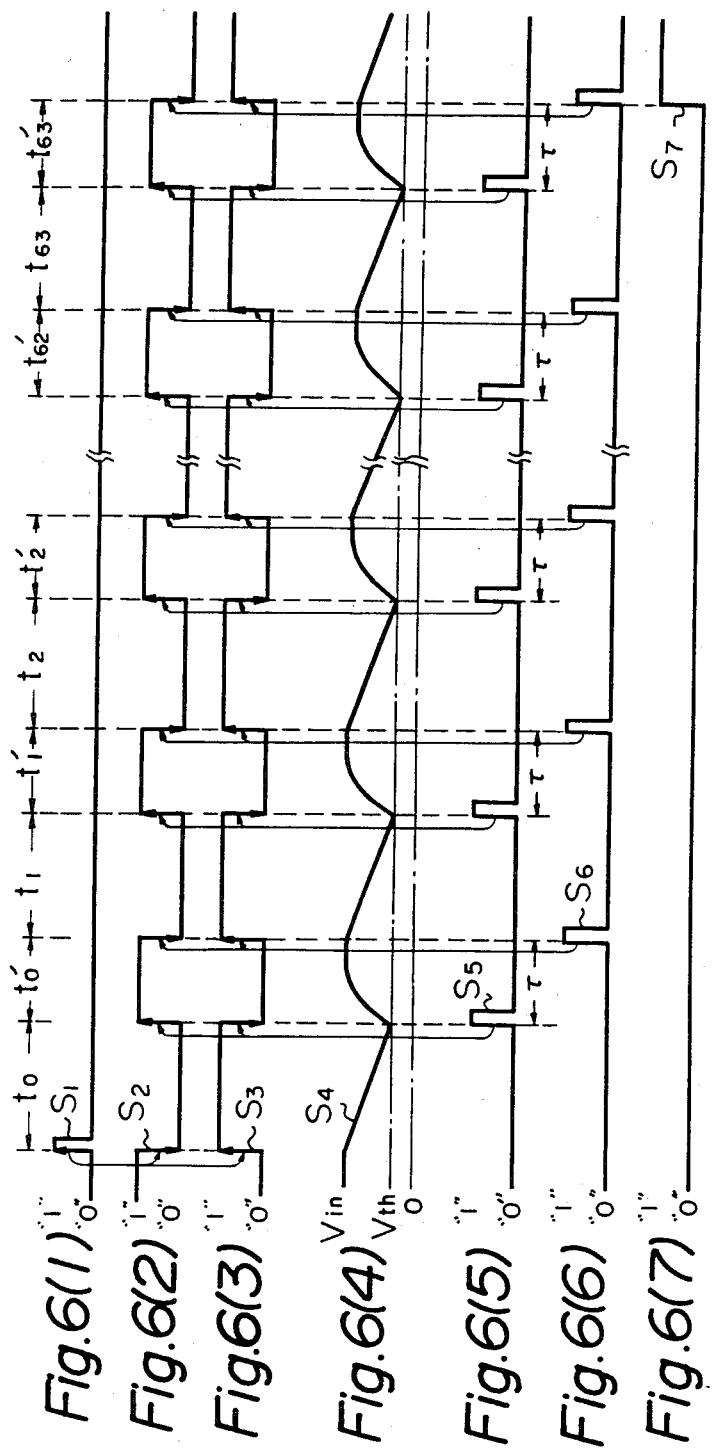

INTEGRATION TYPE ANALOG-TO-DIGITAL CONVERTER HAVING CONTINUOUSLY CHARGING AND DISCHARGING FUNCTIONS

This is a continuation of co-pending application Ser. No. 380,699 filed on May 21, 1982, abandoned.

BACKGROUND OF THE INVENTION

The present invention relates to an analog-to-digital (A/D) converter, more particularly, to an integration-type A/D converter.

In general, A/D converters are divided into successive comparison-types and integration-types. A successive comparison-type A/D converter, which includes a digital-to-analog (D/A) converter, compares an analog voltage with successive outputs of the D/A converter. This successive comparison-type converter features a relatively high conversion rate, but is low in accuracy and high in manufacturing cost. On the other hand, an integration-type A/D converter, which uses a constant slope approach, is high in accuracy and low in manufacturing cost, but features a relatively low conversion rate.

A prior art integration-type A/D converter (see: IEEE Journal of Solid-State Circuits, Vol. SC-15, No. 1, February 1980) comprises a charging switch, a capacitor, a constant current source, a discharging switch, a detection circuit, and a timer-counter. During the charging mode, the charging and discharging switches are turned on and off, respectively, to charge the capacitor and disable the constant current source. Next, during the discharging mode, the charging and discharging switches are turned off and on, respectively, to activate the constant current source and, accordingly, discharge the capacitor. Simultaneously, the timer-counter is initiated. In this case, the voltage of the capacitor is monitored by the detection circuit which, in turn, detects whether or not the voltage reaches a predetermined value (threshold value). At the threshold crossing, the detection circuit stops the timer-counter. This value of the timer-counter is used as a digital value. More precisely, the ratio of this value to a reference value is used as a digital value.

In the above-mentioned prior art A/D converter in order to enhance the accuracy, or in other words, in order to enlarge the time-period of the discharging operation, the capacitance of the capacitor needs to be so large that the capacitor must be an external component. Therefore, an on-chip A/D converter needs more external pins, reducing the manufacturing yield and, accordingly, increasing the manufacturing cost. In addition, high accuracy cannot be expected, since the noise generated from the external pins increases. Further, the provision of such an external capacitor is disadvantageous when the A/D converter is incorporated into a signal processor or a one-chip microcomputer.

SUMMARY OF THE INVENTION

It is, therefore, an object of the present invention to provide an A/D converter with a small capacitor, which can be incorporated into a chip, thereby reducing the number of pins for the chip, thus improving the manufacturing yield, that is, reducing the manufacturing cost.

It is another object of the present invention to provide an A/D converter having high accuracy.

According to the present invention, there is provided an A/D converter comprising at least one charging and discharging circuit, each charging and discharging circuit comprising: a charging switch for inputting an analog voltage; a capacitor connected to the charging switch and charged by the on-state of the charging switch; a constant current source, connected to the capacitor, for discharging the charges stored in the capacitor; a discharging switch, connected between the capacitor and the constant current source, for activating the constant current source; a detection circuit, connected to the capacitor, for detecting whether or not the voltage of the capacitor reaches a predetermined value; and a counter means, connected to the detection circuit, for counting the number of times the predetermined value is detected by the detection circuit so as to generate an output signal when the number reaches a predetermined number. The A/D converter further comprises a control circuit connected to the detection circuit, and to the charging and discharging switch of each charging and discharging circuit, for controlling the charging switch and the discharging switch, so that the charging and discharging operations are performed alternately and continuously upon each charging and discharging circuit. The A/D converter still further comprises a timer-counter initiated by a start signal and stopped in response to the output signal of the counter means of each charging and discharging circuit.

The present invention will be understood more clearly from the description as set forth below, contrasting the present invention with the prior art, and with reference to the accompanying drawings.

BRIEF DESCRIPTION OF THE DRAWINGS

FIGS. 6(1) through 6(7) are timing diagrams of the signals appearing in the circuit of FIG. 5.

DESCRIPTION OF THE PREFERRED EMBODIMENTS

Figure 1:
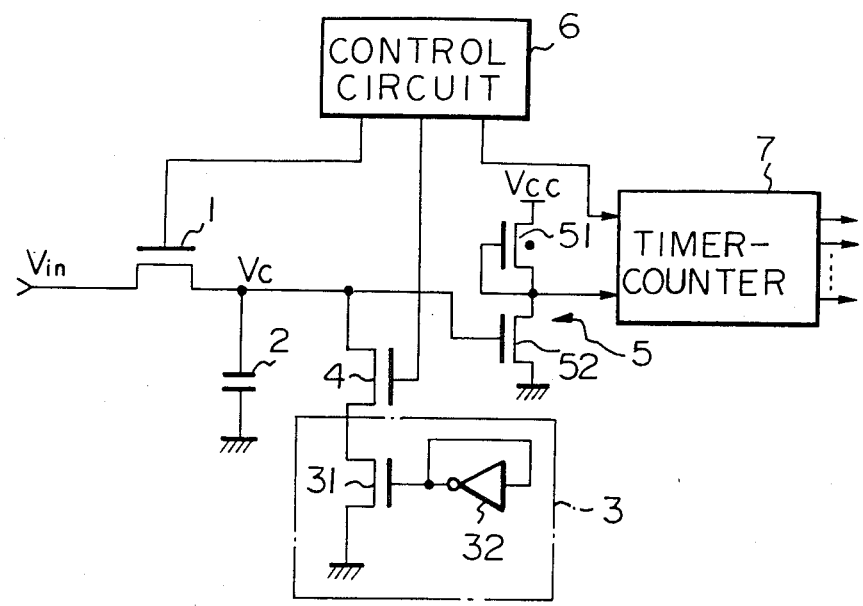
FIG. 1 is a circuit diagram of a prior art A/D converter.
Figure 2:
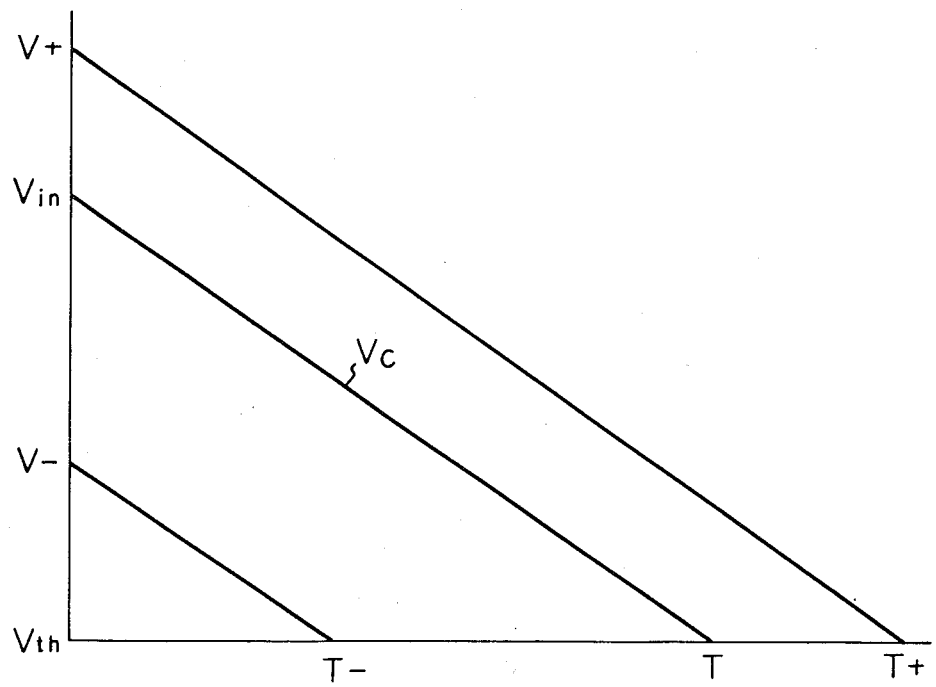
FIG. 2 is a timing diagram of the signals appearing in the circuit of FIG. 1.

The embodiment of FIG. 1 is similar to FIG. 2 of the IEEE Journal of Solid-State Circuits, Vol. SC-15, No. 1, p. 40, February 1980, except for a level shifter. In FIG. 1, 1 is an enhancement metal oxide semiconductor (MOS) (broadly, a metal-insulated semiconductor (MIS)) transistor serving as a charging switch for applying an analog voltage $V_{in}$ to a capacitor 2; 3 is a constant current source formed of an enhancement-type MOS transistor 31 and an inverter 32; 4 is an enhancement-type MOS transistor serving as a discharging switch for activating the constant current source 3; 5 is an inverter (formed from a series connection of an enhancement-type MIS transistor and a depletion-type MIS transistor). serving as a detection circuit; 6 is a control circuit; and 7 is a timer-counter.

The detection circuit 5 is formed by a series connection of a depletion-type MOS transistor 51 and an enhancement-type MOS transistor 52. Therefore, the detection circuit 5 monitors whether or not the voltage of the capacitor 2 reaches a threshold voltage $V_{th}$ of the transistor 52. The timer-counter 7 is initiated by the control circuit 6 and is stopped by the detection circuit 5, so that the timer-counter 7 counts the discharging time-period of the capacitor 2.

The operation of the circuit of FIG. 1 will now be explained. During the charging mode, the control circuit 6 turns on the charging switch 1 and, simultaneously turns off the discharging switch 4. As a result, an analog voltage $V_{in}$ is applied to the capacitor 2 which is, in turn, charged. In this case, the voltage $V_c$ of the capacitor 2 equals $V_{in}$.

Next, during the discharging mode, the control circuit 6 turns off the charging switch 1 and turns on the discharging switch 4. In addition, the control circuit 6 initiates the timer-counter 7 which begins to count clock signals (not shown). As a result, the capacitor 2 is discharged through the constant current source 3. Next, when the detection circuit 5 detects the fact that the voltage $V_c$ of the capacitor 2 reaches the threshold voltage $V_{th}$ of the transistor 52, the output of the detection circuit 5 is changed from the logical "0" level to the logical "1" level, stopping the timer-counter 7. At this time, the value T of the timer-counter 7 represents a digital value corresponding to the analog voltage $V_{in}$. Referring to FIG. 2, if it takes time-periods $T_+$ and $T_-$ for upper and lower reference voltages $V_+$ and $V_-$, respectively, to reach the threshold voltage $V_{th}$, the analog voltage $V_{in}$ can be represented by $$V_{in} = V_- + \frac{T_+ - T}{T_+ - T_-} (V_+ - V_-).$$

The measured accuracy for the above-mentioned digital value T is determined by the capacitor 2 and the constant current source 3. In order to enhance the accuracy, it is necessary to increase the capacitance of the capacitor 2 or to reduce the current flowing through the constant current source 3. However, when the A/D converter of FIG. 1 is incorporated into a chip, it can, in view of the manufacturing process thereof, reduce the current flowing through the constant current source 3 by only a limited degree. On the other hand, it is difficult to increase the capacitance of the capacitor 2, since, in this case, the area that can be occupied on the chip by the capacitor 2 is limited. For example, according to the conventional manufacturing process, the minimum value of the current flowing through the constant current source 3 is on the order of $\mu$As, while the maximum value of the capacitance of the capacitor 2 is on the order of pF. In this case, it takes $10^{-12} \times 1/1 \times 10^{-6}$ sec. = 1 $\mu$s to discharge the capacitor 2 from 1 V to 0 V. Even if this value is counted by a 1 $\mu$s counter, accuracy more than 1 V cannot be expected. Therefore, in the prior art, the capacitor 2 is constructed as an external component having a capacity of $10^3$ pF to 1 $\mu$F. As a result, the number of external pins of a chip including the A/D converter increases and the manufacturing yield declines, which increases the manufacturing cost. In addition, high accuracy cannot be expected, since the noise generated from the external pins increases.

Figure 3:
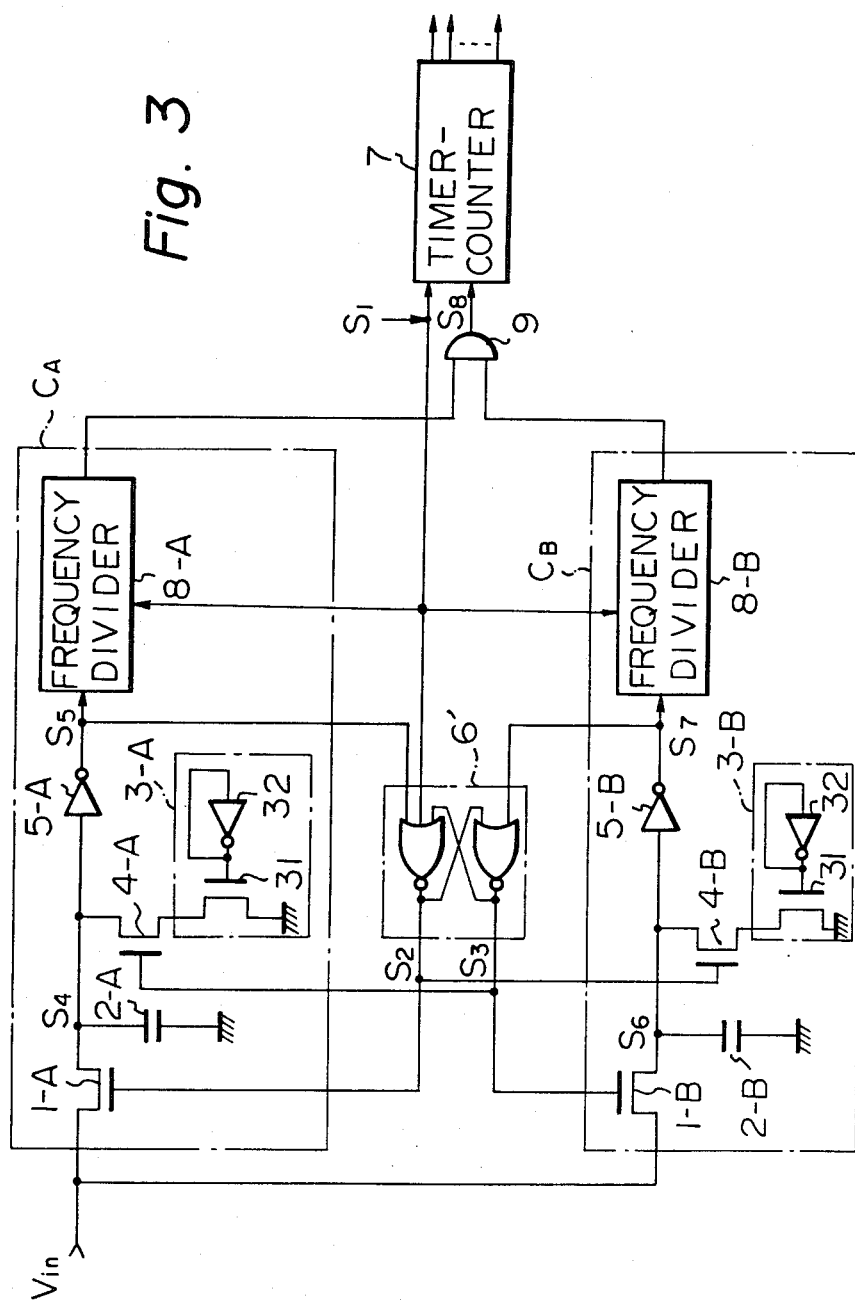
FIG. 3 is a circuit diagram of an embodiment of the A/D converter according to the present invention.

FIG. 3 is a circuit diagram illustrating an embodiment of the A/D converter according to the present invention. In FIG. 3, two charging and discharging circuits $C_A$ and $C_B$ which are the same are provided. The charging and discharging circuit $C_A$ ($C_B$) comprises a charging switch 1-A (1-B), a capacitor 2-A (2-B), a constant current source 3-A (3-B), a discharging switch 4-A (4-B), a detection circuit 5-A (5-B) (corresponding to the inverter 5 of FIG. 1); and a 1/N frequency divider 8-A (8-B). The frequency divider 8-A produces a logical "1" level signal after the output of the detection circuit 5-A has risen a predetermined number of times, N, for example, $64 = 2^6$.

A control circuit 6', which comprises a flip-flop, receives the output signals $S_5$ and $S_7$ from the detection circuits 5-A and 5-B and controls the charging switches 1-A and 1-B and the discharging switches 2-A and 2-B.

A timer-counter 7 is initiated by a start signal $S_1$ and is stopped by a logical product signal produced by the output signals of the frequency dividers 8-A and 8-B through an AND circuit 9. When the timer-counter 7 stops, the value T of the timer-counter 7 corresponds to the analog voltage $V_{in}$.

It should be noted that in the circuit of FIG. 3, the capacitance of each of the capacitors 2-A and 2-B is on the order of 0.1 pF at most and, therefore, the entire circuit of FIG. 3 can be incorporated into a chip.

Figure 4:
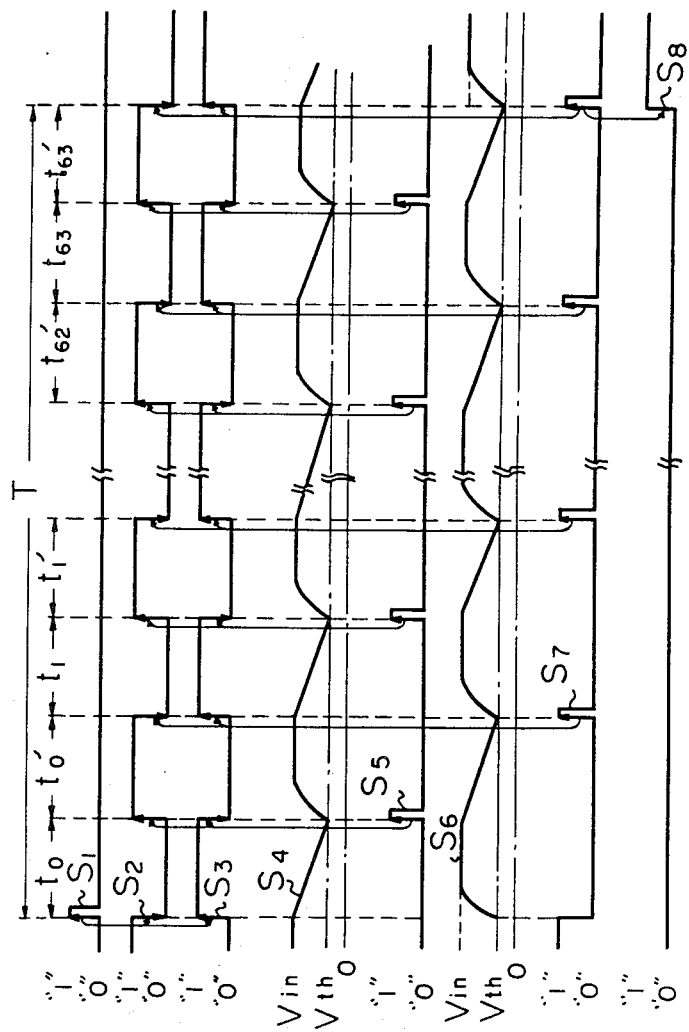
FIGS. 4(1) through 4(8) are timing diagrams of the signals appearing in the circuit of FIG. 3.

FIGS. 4(1) through 4(8) are timing diagrams of the signals appearing in the circuit of FIG. 3. Referring to FIGS. 4(1) through 4(8), the operation of the circuit of FIG. 3 will now be explained. When the potential of the start signal $S_1$ is changed from low (logic "0" level) to high (logic "1" level) as illustrated in FIG. 4(1), the potential of the output signal $S_2$ of the control circuit 6' falls, while the potential of the output signal $S_3$ rises. In addition, the frequency counters 8-A and 8-B and the timer-counter 7 are reset by the start signal $S_1$. Simultaneously, the timer-counter 7 is initiated to count clock pulses (not shown). As a result, in the charging and discharging circuit $C_A$, the charging switch 1-A and the discharging switch 4-A ae turned off and on, respectively, changing the state of the charging and discharging circuit $C_A$ from the charging mode to the discharging mode. On the other hand, in the charging and discharging circuit $C_B$, the charging switch 1-B and the discharging switch 4-B are turned on and off, respectively, changing the state of the charging and discharging circuit $C_B$ from the discharging mode to the charging mode. That is, during the time-periods $T_0, t_1, \ldots, t_{63}$, the charging and discharging circuit $C_A$ is in the discharging mode, while the charging and discharging circuit $C_B$ is in the charging mode.

During the time-periods $t_0, t_1, \ldots, t_{63}$, as illustrated in FIG. 4(4), the voltage $S_4$ of the capacitor 2-A of the circuit $C_A$ is changed from $V_{in}$ to $V_{th}$, which is a threshold voltage of the detection circuit 5-A. Therefore, at the end of each of the time-periods $t_0, t_1, \ldots, t_{63}$, the detection circuit 5-A sends a signal $S_5$, as illustrated in FIG. 4(5), to the frequency divider 8-A, which, in turn, counts each rise of the signal $S_5$. Simultaneously, the detection circuit 5-A sends the signal $S_5$ to the control circuit 6' which, in turn, changes the state thereof. That is, the potential of the signal $S_2$ is changed from low to high as illustrated in FIG. 4(2), while the potential of the signal $S_3$ is changed from high to low as illustrated in FIG. 4(3). In the charging and discharging circuit $C_A$, the charging switch 1-A and the discharging switch 4-A are turned on and off, respectively, changing the state of the circuit $C_A$ from the discharging mode to the charging mode. On the other hand, in the charging and discharging circuit $C_B$, the charging switch 1-B and the discharging switch 4-B are turned off and on, respectively, changing the state of the circuit $C_B$ from the charging mode to the discharging mode. That is, during the time-periods $t_0'$, $t_1'$, ..., $t_{63}'$, the charging and discharging circuit $C_A$ is in the charging mode, while the charging and discharging circuit $C_B$ is in the discharging mode.

During these time-periods, as illustrated in FIG. 4(6), the voltage $S_6$ of the capacitor 2-B of the circuit $C_B$ is changed from $V_{in}$ to $V_{th}$. Therefore, at the end of each of the time-periods $t_0'$, $t_1'$, ..., $t_{63}'$, the detection circuit 5-B sends a signal $S_7$, as illustrated in FIG. 4(7), to the frequency divider 8-B, which, in turn, counts each rise of the signal $S_7$.

Thus, the control circuit 6' performs the charging and discharging operations, alternately and continuously, with the charging and discharging circuits $C_A$ and $C_B$. When the number of the discharging operations performed by each of the charging and discharging circuits $C_A$ and $C_B$ reaches 64, the outputs of the frequency dividers 8-A and 8-B both become high. As a result, the potential of the output signal $S_8$ of the AND circuit 9 becomes high, as illustrated in FIG. 4(8), so as to stop the timer-counter 7. At this time, the value T of the timer-counter 7 corresponds to the sum of the time-periods $t_0$, $t_0'$, $t_1$, $t_1'$, ..., $t_{63}$, $t_{63}'$.

The accuracy of each time-period $t_0$, $t_0'$, $t_1$, $t_1'$, ..., $t_{63}$, $t_{63}'$ is low, since the capacity of the capacitors 2-A and 2-B is small. However, the time-period T appearing in the timer-counter 7 corresponds to the sum of the time-periods $t_0$, $t_0'$, $t_1$, $t_1'$, ..., $t_{63}$, $t_{63}'$ multiplied by 1/N, that is, the mean value of these time-periods. Therefore, the statistical fluctuation is small, and, the accuracy of the value T is high.

Note that, in FIG. 3, one of the frequency dividers 8-A or 8-B can be omitted. For example, if the frequency divider 8-B is omitted, the frequency divider is constructed as a $\frac{1}{2}$N frequency divider, that is, $1/128 = 2^{12}$, which is connected directly to the timer-counter 7.

Figure 5:
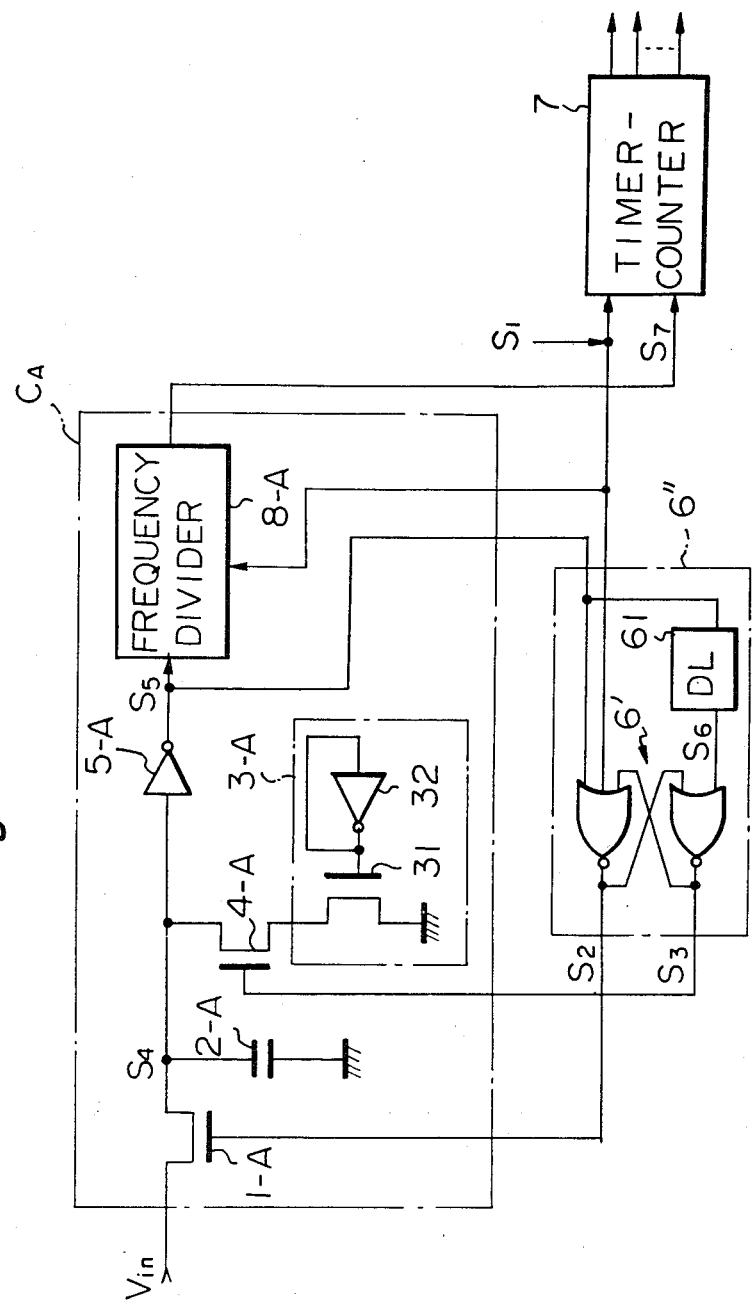
FIG. 5 is a circuit diagram of another embodiment of the A/D converter according to the present invention.

FIG. 5 is a circuit diagram illustrating another embodiment of the A/D converter according to the present invention. In FIG. 5, only one charging and discharging circuit $C_A$ is provided. A control circuit 6" comprises a delay circuit 61 in addition to the control circuit 6' of FIG. 3.

FIGS. 6(1) through 6(7) are timing diagrams of the signals appearing in the circuit of FIG. 5. Referring to FIGS. 6(1) through 6(7), the operation of the circuit of FIG. 5 will now be explained. When the potential of the start signal $S_1$ is changed from low to high, as illustrated in FIG. 6(1), the potential of the output signal $S_2$ of the control circuit 6" falls, while the potential of the output signal $S_3$ rises. In addition, the frequency divider 8-A and timer-counter 7 are reset by the start signal $S_1$. Simultaneously, the timer-counter 7 is initiated to count clock pulses (not shown). As a result, in the charging and discharging circuit $C_A$, the charging switch 1-A and the discharging switch 4-A are turned off and on, respectively, so that the state of the charging and discharging circuit $C_A$ is changed from the charging mode to the discharging mode.

That is, during the time-periods $t_0$, $t_1$, ..., $t_{63}$, the charging and discharging circuit $C_A$ is in the discharging mode. During the time-periods $t_0$, $t_1$, ..., $t_{63}$, as illustrated in FIG. 6(4), the voltage $S_4$ of the capacitor 2-A of the circuit $C_A$ is changed from $V_{in}$ to $V_{th}$, which is a threshold voltage of the detection circuit 5-A. At the end of each of the time-periods $t_0$, $t_1$, ..., $t_{63}$, the detection circuit 5-A sends a signal $S_5$, as illustrated in FIG. 6(5), to the frequency divider 8-A which, in turn, counts each rise of the signal $S_5$. Simultaneously, the detection circuit 5-A sends the signal $S_5$ to the control circuit 6" which, in turn, changes the state of the signal $S_2$ from low to high, as illustrated in FIG. 6(2), while the potential of the signal $S_3$ is changed from high to low, as illustrated in FIG. 6(3). As a result, in the charging and discharging circuit $C_A$, the charging switch 1-A and the discharging switch 4-A are turned on and off, respectively, so that the state of the circuit $C_A$ is changed from the discharging mode to the charging mode. That is, during the time-periods $t_0'$, $t_1'$, ..., $t_{63}'$, the charging and discharging circuit $C_A$ is in the charging mode.

At the end of each time-period $t_0'$, $t_1'$, ..., $t_{63}'$, as illustrated in FIG. 6(6), an output signal $S_6$, which is obtained by delaying the signal $S_5$, changes the state of the control circuit 6" and, accordingly, changes the state of the charging and discharging circuit $C_A$ from the charging mode to the discharging mode.

Note that each time-period $t_0'$, $t_1'$, ..., $t_{63}'$ equals $\tau$, which is the delay time of the delay circuit 61.

Thus, the control circuit 6" performs the charging and discharging operations, alternately and continuously, with the charging and discharging circuit $C_A$. When the number of the discharging operations performed by the charging and discharging circuit $C_A$ reaches 64, the output of the frequency divider 8-A becomes high. As a result, the potential of the output signal $S_7$ of the frequency divider 8-A becomes high, as illustrated in FIG. 6(7), stopping the timer-counter 7. At this time, the value T of the timer-counter 7 corresponds to the sum of the time-periods $t_0$, $t_0'$, $t_1$, $t_1'$, ..., $t_{63}$, $t_{63}'$.

Thus, the operation of the circuit of FIG. 5, is similar to the operation of the circuit of FIG. 3.

Note that both of the circuits of FIGS. 3 and 5 can be manufactured by using MOS manufacturing technology. In addition, in the A/D converter according to the present invention, more than three charging and discharging circuits can be provided. In this case, the discharging operation is performed sequentially and continuously on the charging and discharging circuits.

As explained, the A/D converter according to the present invention is advantageous in that the entire A/D converter can be incorporated into a chip. The resultant decrease in necessary external pins can improve the manufacturing yield, that is, the manufacturing cost. Further, since the discharging operation is repeated by one or more charging and discharging circuits, the accuracy remains high.

We claim:

1. An analog-to-digital converter operatively connectable to receive a start signal, comprising:
   at least two charging and discharging circuits, each charging and discharging circuit comprising:
   a charging switch for inputting an analog voltage and having an on state;
   a capacitor, operatively connected to said charging switch, charged during the on-state of said charging switch;
   a constant current source, operatively connected to said capacitor, for discharging the charges stored in said capacitor;
   a discharging switch, operatively connected between said capacitor and said constant current source, for activating said constant current source;

a detection circuit, operatively connected to said capacitor, for detecting whether the voltage of said capacitor reaches a predetermined value; and counter means, operatively connected to said detection circuit, for counting the number of times said predetermined value is detected by said detection circuit and for generating an output signal when the number reaches a predetermined number;

a control circuit, operatively connected to said detection circuit, said charging switch, and said discharging switch of each said charging and discharging circuit, for controlling said charging switch and said discharging switch, the charging and discharging operations being performed alternately and continuously upon each charging and discharging circuit; and a timer-counter, operatively connected to said counter means of each said charging and discharging circuit and operatively connectable to receive the start signal, initiated in response to the start signal and stopped in response to the output signal of said counter means from each said charging and discharging circuit.

2. An analog-to-digital converter as set forth in claim 1, wherein said counter means comprises a frequency divider operatively connected to said detection circuit and said timer counter.

3. An analog-to-digital converter as set forth in claim 1, wherein said detection circuit comprises an inverter, operatively connected to said capacitor, said counter means and said control circuit, and including a series connection of a depletion-type MIS transistor and an enhancement-type MIS transistor.

4. An analog-to-digital converter as set forth in claim 1, wherein the number of said charging and discharging circuits is two.

5. An analog-to-digital converter as set forth in claim 4, wherein said control circuit comprises a flip-flop having two inputs each operatively connected to a different one of said detection circuits and having two outputs each operatively connected to one of said charging switches and to one of said discharging switches.

* * * * *